United States Patent [19]

Silver

[11] Patent Number: 4,672,359
[45] Date of Patent: Jun. 9, 1987

[54] SUPERCONDUCTING ANALOG-TO-DIGITAL CONVERTER AND DIGITAL MAGNETOMETER AND RELATED METHOD FOR ITS USE

[75] Inventor: Arnold H. Silver, Rancho Palos Verdes, Calif.

[73] Assignee: TRW Inc., Redondo Beach, Calif.

[21] Appl. No.: 797,314

[22] Filed: Nov. 12, 1985

[51] Int. Cl.$^4$ ............................................. H03M 1/12
[52] U.S. Cl. .............................. 340/347 AD; 324/248
[58] Field of Search ................. 340/347 AD, 347 NT; 324/248; 357/5; 338/325; 307/245, 277, 306

[56] References Cited

U.S. PATENT DOCUMENTS 3,192,371  6/1965  Brahm ........................... 340/347 AP
4,340,883  7/1982  Cook ............................. 340/347 NT

FOREIGN PATENT DOCUMENTS 2115552A  9/1983  United Kingdom ................. 324/248

*Primary Examiner*—Charles D. Miller
*Attorney, Agent, or Firm*—Noel F. Heal

[57] ABSTRACT

A device for use as an analog-to-digital converter or a digital magnetometer using a double-junction superconducting quantum interference device (SQUID) and having an extremely fine sensitivity, but a large dynamic range and the ability to handle rapid signal slew rates. The SQUID receives a composite signal, including the analog signal, a correction signal, and a high-frequency dither signal, the latter being selected to produce two output pulses from the SQUID when operated at a quiescent operating point. Departure from the operating point is detected by monitoring the SQUID output pulses and controlling a feedback register to record the degree of movement from the operating point. The feedback register provides the less significant bits of digital output from the converter. The value stored in the feedback register is also converted to analog form and fed back to the SQUID as the correction signal, thereby locking the device onto the desired operating point. Rapid or slow movement equivalent to more than one flux quantum is also detected in the device, and is recorded in an integer register, which provides the more significant bits of the digital output.

18 Claims, 3 Drawing Figures

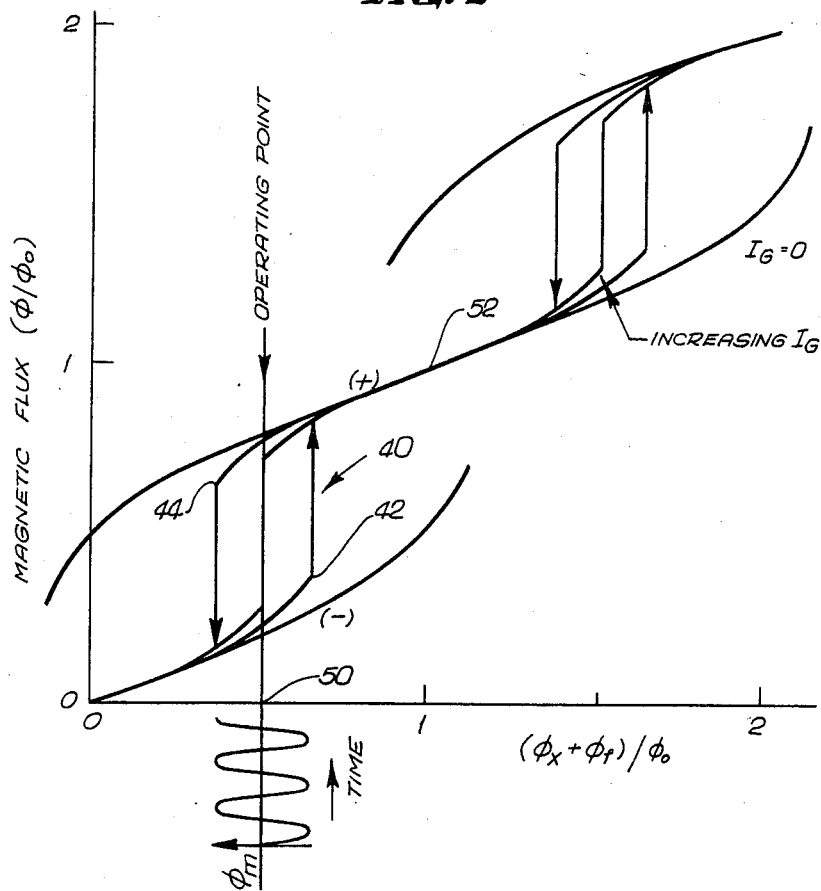
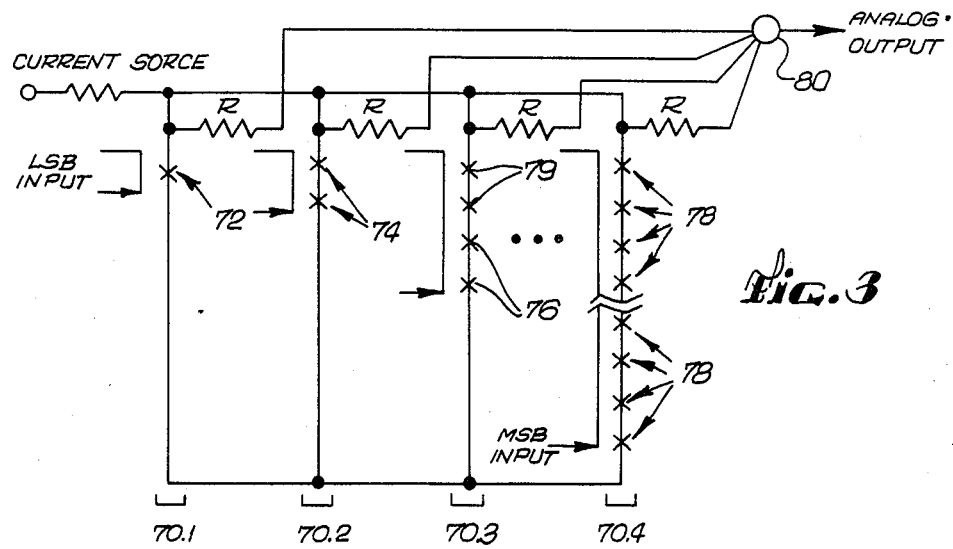

SUPERCONDUCTING ANALOG-TO-DIGITAL CONVERTER AND DIGITAL MAGNETOMETER AND RELATED METHOD FOR ITS USE

CROSS-REFERENCE TO RELATED APPLICATION

This application is related to Ser. No. 648,868, filed on Sept. 7, 1984, entitled "Superconducting Analog-to-Digital Converter with Bidirectional Counter", invented by Arnold H. Silver et al.

BACKGROUND OF THE INVENTION

This invention relates generally to high-performance magnetometers and analog-to-digital (A/D) converters and, more particularly, to techniques for A/D conversion employing superconducting Josephson junction devices. There is a requirement for high-performance A/D conversion equipment in both military and commercial applications. Performance criteria include sensitivity, dynamic range, and sampling rate. High sensitivity instruments, such as magnetometers and gradiometers, employing superconducting devices typically suffer from limitations in their signal bandwidth, their ability to handle rapid slew rates of incoming signals, and their dynamic range. As will be further explained, the present invention overcomes these disadvantages.

A/D conversion using Josephson junctions has been described in the technical literature. John P. Hurrell et al. describe one such technique in a paper entitled "Analog-to-Digital Conversion with Unlatched SQUID's", published in the IEEE Transactions on Electron Devices, Vol. ED-27, No. 10, pp. 1887-96 (October 1980). SQUID is an acronym for Superconducting Quantum Interference Device.

The theory of operation of SQUID's for use in A/D conversion is explained in detail in the Hurrell et al. paper, and only a simplified explanation will be provided here. Similarly, the theory of operation of Josephson junctions is now widely known, and has been the subject of discussion in many technical papers. For example, see B. D. Josephson, "Supercurrents through Barriers", Advan. Phys., Vol. 14, pp. 419-51 (1965), and other papers cited in the Hurrell et al. paper.

A Josephson junction has a current-voltage characteristic that includes a region in which the current increases rapidly from zero, with practically no corresponding increase in voltage across the device. A SQUID is a circuit including one or more Josephson junctions and one or more inductive loads. A single-junction SQUID includes a Josephson junction connected across an inductance. If a current is injected into one end of the inductance and the other end is grounded, the resulting characteristics provide the basis for A/D conversion, as explained in detail in the Hurrell et al. paper.

The most pertinent property of the single-junction SQUID, from the standpoint of A/D conversion, is the relationship between the magnetic flux in the SQUID and the value of the injected current. This flux-current relationship is a periodic function and, depending on the circuit parameters chosen, a multi-valued function. The most significant aspect of the relationship is that the flux changes by a small quantum whenever the current increases by a small and precisely repeatable increment. This quantum of flux gives rise to a small but measurable voltage pulse across the junction. When the current is decreased, a flux quantum of opposite polarity is produced for each precise decrement of current, and a corresponding voltage pulse of opposite polarity is produced across the junction.

This property of the single-quantum SQUID forms the basis for the A/D converter described in the Hurrell et al. paper. A signal to be converted from analog to digital form is introduced into the single-junction SQUID as a varying current. Each time the current decreases by a predetermined increment, a measurable voltage pulse is generated across the junction. In this manner, the single-junction SQUID functions as a quantizer. The resultant pulses are then detected and counted in one or more counters. The principal advantage of the arrangement is its near perfect linearity. Another advantage is its sensitivity. The current increment, which determines the resolution, can be made extremely small. The flux quantum is only $2.07 \times 10^{-15}$ weber, and the current increment is given by this value divided by the value of the load inductance (measured in henries).

Although the periodic nature of the current-flux relationship results in a highly accurate device, the basic mode of operation described suffers from two important limitations. One is that, if the input signal slews rapidly in value, it may not be possible to detect each of the flux transitions that occur. The other is that the sensitivity of the device in its basic form is limited to one flux quantum. Attempts to obtain sensitivity less than one quantum have resulted in a very much limited dynamic range. One attempt to provide finer sensitivity involves the use of a feedback signal to maintain a stable operating point on the flux-current curve. Basically, this is accomplished by applying a high-frequency "dither" current to the Josephson device and sensing any resulting output signals at the dither frequency. A feedback loop is used to drive the high-frequency output component to zero, a condition that will be obtained only if the operating point on the flux-current curve is at the desired location. In effect, the feedback signal provides an indication of the degree to which the input signal being converted differs from a signal that would have left the operating point undisturbed. However, this arrangement still suffers from limitations in slew rate and dynamic range. In addition, the approach requires the use of analog amplifiers or integrators, which may detract from the accuracy of the device.

A number of patents disclose superconducting A/D converters of various designs. U.S. Pat. No. 3,983,419 to Fang discloses a SQUID that can be used as either a sample-and-hold device or as a pulse generator coupled to an analog signal. The resulting signals can then be used in an A/D converter, the details of which are not disclosed. U.S. Pat. No. 3,458,735 to Fiske discloses a system for employing a plurality of Josephson junctions for A/D conversion. U.S. Pat. No. 4,315,255 to Harris et al. discloses an A/D converter using multiple SQUID's of the voltage latching type.

Another patent disclosing an A/D converter using Josephson junctions U.S. Pat. No. 3,949,395 to Klein. The Klein device uses multiple, voltage latching Josephson junctions as comparison devices in a successive approximation technique of conversion.

It will be appreciated from the foregoing that there is still a need for improvement in the field of superconducting A/D converters. The ideal converter should have high sensitivity and speed, but also a large dynamic range and the ability to accept input signals with rapid slew rates. The present invention is directed to these ends.

SUMMARY OF THE INVENTION

The present invention resides in a superconducting magnetometer or analog-to-digital converter having a sensitivity equivalent to a small fraction of a single flux quantum, but also having a large dynamic range and the ability to handle rapid input signal slew rates. Briefly, and in general terms, the device of the invention includes a double-junction superconducting quantum interference device (SQUID) having first and second Josephson junctions and a center-tapped load inductance, means for applying a constant gate current to the center of the load inductance, and means for applying a bidirectionally varying analog signal current to the load inductance. Positive incremental changes in the load inductance current result in the generation of voltage pulses across the first junction, and negative incremental changes in the load inductance current result in the generation of voltage pulses across the second junction.

In addition, the device of the invention includes means for applying a correction current signal to the load inductance to maintain the SQUID at a desired operating point in its flux-current characteristic, and means for applying a high-frequency dither signal current to the load inductance such that, when the correction current is maintaining the SQUID at its desired operating point, each cycle of the dither current signal produces an output pulse from each of the junctions, means for generating from the output pulses a digital value equivalent to the analog input signal, and means for generating the correction current from the digital value.

The correction current is indicative of the amount by which the analog signal would, but for the application of the correction current, move the operating point away from its desired location. The correction signal therefore maintains the operating point at the desired location, and in so doing generates a digital signal indicative of the analog signal as a fraction of a single quantum value. However, the range of the device is not limited to one quantum value, since the means for generating a digital value also includes means for maintaining a count equivalent to the integral number of flux quanta by which the analog signal has changed. This count is also associated with a quantized change in the quiescent operating point, to the next periodically occurring and equivalent operating point.

More specifically, the means for generating a digital signal includes means for detecting voltage pulses from the SQUID, a feedback register, an integer register, and control means for adjusting the feedback register and the integer register in response to the output pulses detected from the SQUID. The feedback register contains a count indicative of a fraction of a single flux quantum. When the analog signal changes in such a manner as to move the operating point of the SQUID, the control means increments or decrements the feedback register. The feedback register is selected to overflow when the analog current changes by an amount equivalent to one flux quantum. Thus, when the current has changed by an amount sufficient to move the operating point to the next transition point in the flux-current characteristic, the feedback register is cleared to zero and the the integer register is incremented by one. This effectively moves the operating point to the next suitable location on the curve, and keeps count of the number of flux quanta in the integer register. The feedback register is connected to a digital-to-analog converter, the output of which is the correction current fed back to the SQUID.

In terms of a novel method of converting an analog signal to digital form, the invention comprises the steps of applying the analog signal to the SQUID, applying a gate current to the SQUID to produce a characteristic flux-current curve with periodic hysteresis loops, and applying a high-frequency dither signal to the SQUID to produce two output pulses per cycle of the dither signal, so long as the operating point is maintained at a quiescent point centrally located with respect to one of the hysteresis loops. The method further includes the steps of detecting the presence or absence of output pulses from the SQUID junctions, determining from the detected pulses whether the analog signal applied to the SQUID is tending to move the operating point along the SQUID characteristic curve, incrementing a feedback register if movement is sufficient to result in non-detection of one of the pulses normally expected in a cycle, converting the value stored in the feedback register into an analog correction signal, and applying the correction signal to the SQUID to compensate for the detected movement in the operating point. This effectively locks the operating point at a desired position, and the feedback register is continuously indicative of the degree by which the analog signal differs from a signal value corresponding to the operating point.

The method may further include the steps of determining from the detected pulses whether the analog signal has slewed from its previously detected value by more than at least one full quantum, and incrementing an integer register to record the number of full flux quanta by which the analog signal has changed.

Another aspect of the method invention includes the steps of detecting when the feedback register overflows, which is indicative of a full quantum of movement of the analog signal, and incrementing the integer register and simultaneously clearing the feedback register when the overflow is detected.

From this summary it will be apparent that the feedback register contains a number of bits of the desired digital result, at the least significant end of the result. The integer register contains the remainder of the digital result, at the most significant end.

The control means of the invention takes care of rapidly slewing input signals, since these can also be detected in the SQUID. If a signal slews so rapidly that two transitions are detected in the same direction, this indicates that the operating point of the device has effectively jumped to the next multi-valued location on the characteristic curve. The control means increments or decrements the integer register to take care of this situation, so that even signals that slew more rapidly than the dither signal rate will be correctly converted by the device of the invention.

It will be apparent from the foregoing that the present invention represents a significant advance in the field of high-performance analog-to-digital converters. In particular, the converter of the invention achieves an extremely high sensitivity, but without loss of dynamic range and with the ability to handle high input signal slew rates. Other aspects and advantages of the invention will become apparent from the following more detailed description, taken in conjunction with the accompanying drawings.

BRIEF DESCRIPTION OF THE DRAWINGS

FIG. 2 is a graph of the characteristic flux-current curve for a SQUID as used in the converter of the invention;

FIG. 3 is a schematic diagram of a digital-to-analog converter for use in the analog-to-digital converter of FIG. 1.

DESCRIPTION OF THE PREFERRED EMBODIMENT

Figure 1:
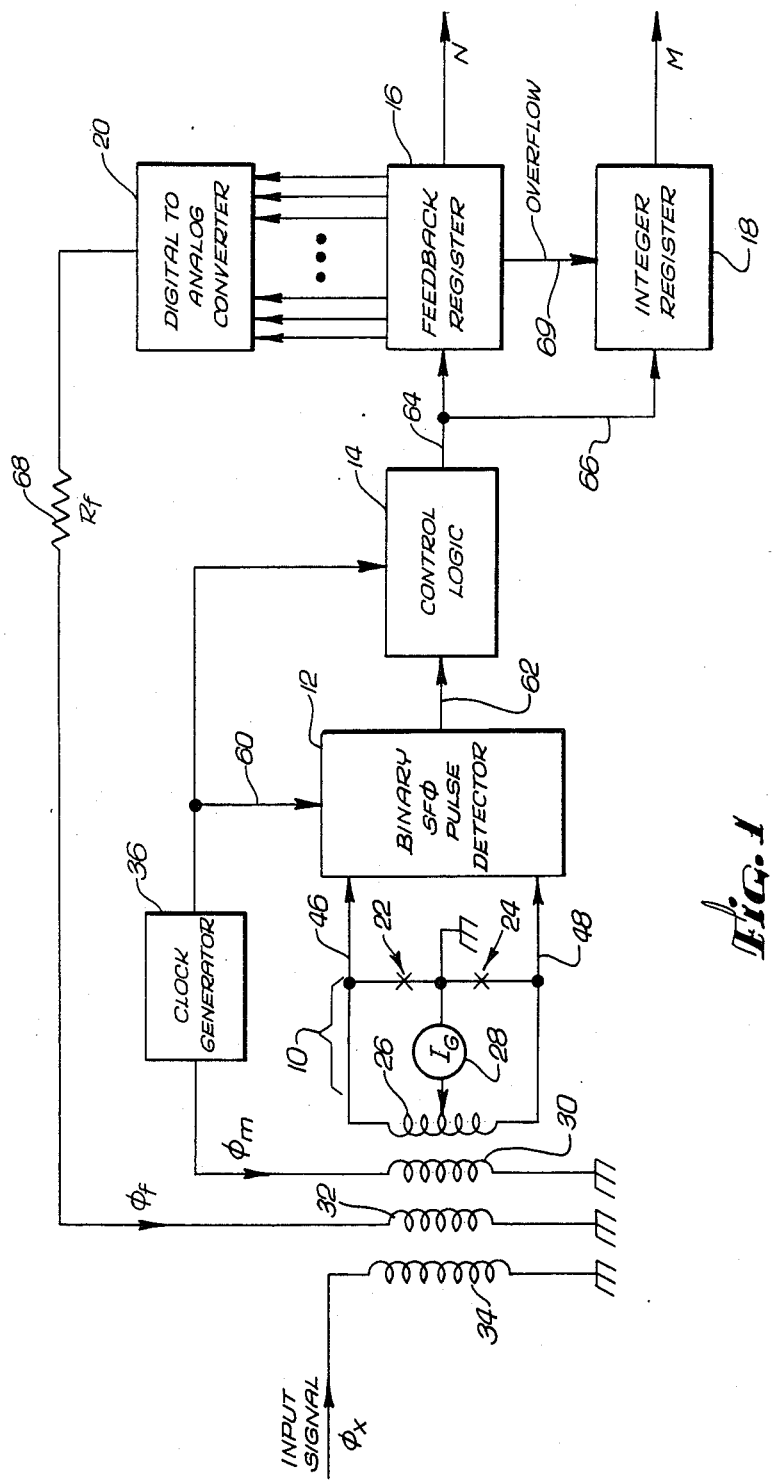
FIG. 1 is a block diagram of an analog-to-digital converter in accordance with the invention.

As shown in the drawings for purposes of illustration, the present invention is concerned with superconducting analog-to-digital (A/D) converters. In the past, high-performance A/D converters of this type have suffered from limitations in their sensitivity, dynamic range, and ability to handle input signals having rapid high slew rates.

In accordance with the invention, a double-junction superconducting quantum interference device (SQUID) is operated at a desired point in its flux-current characteristic, by applying a correction signal derived from a component of the converted analog signal. As the analog signal changes, the correction signal also changes to maintain the desired operating point.

As shown in FIG. 1, the converter of the invention includes, a double-junction SQUID, indicated generally by reference numeral 10, a binary pulse detector 12, control logic 14, a feedback register 16, an integer register 18, and a digital-to-analog converter (DAC) 20. The SQUID 10 has two Josephson junctions 22 and 24, connected back to back, with a common grounded terminal, and a center-tapped load inductor 26, with a gate current source 28 applied between ground and the inductor center tap. Current is coupled to the load inductor 26 through three input windings: a dither input winding 30, a correction current winding 32 and an analog input winding 34. It will be appreciated that an alternative approach would be to use a single input winding and to combine three input signals with an appropriate connection of resistors to the winding.

An analog input signal is applied to the analog input winding 34, and a high-frequency clock signal is applied from a clock generator 36 to the dither input winding 30. As is well known, the flux-current characteristic of a SQUID device is a periodically varying function like the one shown in FIG. 2. At periodic intervals, the curve exhibits a hysteresis effect and, with an appropriate gate current, assumes multiple flux values. In the device of the invention, the dither signal from the clock generator 36 is selected to have an amplitude just sufficient to cycle the flux and current through the closed loop indicated by numeral 40. At each sudden transition in magnetic flux, at the points 42 and 44, an output pulse is generated by the SQUID. For the positive-going transition, the output pulse is generated on one of the output lines 46 and 48 from the SQUID, and for the negative going transition the pulse is generated on the other of the two output lines. Operation of the double-junction SQUID in this manner is described in the cross-referenced patent application. So long as the operating point of the device is maintained at a quiescent operating point 50, the device will continue to generate alternate output pulses on the two output lines 46 and 48. The quiescent operating point is one of the "half-quantum" values occurring with a periodicit $\Phi_0$ $=2.07\times 10^{-15}$ weber. If the device should depart from this operating point and move, for example, to the region indicated by numeral 52, this would result in the non-occurrence of a negative-going transition. If the analog signal should continue to increase, there would next be another positive-going transition, and the device would then be operating at a new operating point in the curve.

It will be apparent from the characteristic curve of FIG. 2 that the current position on the curve can be determined from an analysis of the SQUID output signals. Detecting these signals, which will be referred to as the A and B signals, is accomplished in the binary pulse detector 12. This includes a pair of flip-flops (not shown) of the type disclosed in the cross-referenced application. The flip-flops are enabled by the clock signals, as indicated by line 60 from the clock generator 36. The control logic 14 monitors the state of the flip-flops in the pulse detector 12, as indicated by line 62, and generates control signals on line 64 to the feedback register 16 and on line 66 to the integer register 18, as will now be explained in further detail.

If both the A and B outputs are detected during a clock cycle, this indicates that the dither signal is having the intended effect and is cycling through the hysteresis loop at the desired operating point. In other words, no change is needed to maintain the same operating point for the device.

If an A signal is detected, but not a B signal, this indicates that the operating point has moved away from the hysteresis loop, i.e. that the current has increased by some amount less than the equivalent of a full flux quantum. The action then taken by the control logic 14 is to preset the output to the feedback register to a value of +1. In the next clock cycle, the analog signal will either continue to increase, stay at its new level, or return to its previous level. If it returns to its previous level, near the original operating point, A and B signals will be detected again and no action will be taken by the control logic. However, if the signal continues to increase or stays at its new level, there may be one or more clock cycles during which neither the A nor the B signal is detected. If this is the case, the control logic 14 outputs the preset value to the feedback register. In the example given above, a +1 value would be output to the feedback register, which would be incremented by one.

The key to the invention is that the value stored in the feedback register is converted to an analog value and fed back to the SQUID as a correction current. Conversion to analog form takes place in the DAC 20, the output of which is connected through a feedback resistor 68 to the correction current winding 32.

A similar series of events takes place if the analog signal decreases, resulting in the detection of a B signal but no A signal. The feedback register output is then preset to a value of −1, and if a following cycle detects neither A nor B signals the −1 value is output to the feedback register 16.

There are two other possibilities for the control logic 14. If two or more successive A signals are detected, this indicates that the input signal has slewed from the original operating point to another operating point in one clock cycle. Rather than attempting to correct for this state of affairs, the control logic instead outputs a +1 value to the integer register 18. Similarly, the detection of two successive B signals in the same clock cycle results in the transmission of a −1 to the integer register.

In summary, the control logic performs the following functions. The overlined symbols $\overline{A}$ and $\overline{B}$ mean "not A" and "not B", respectively. The "action taken" in the first line of the following table assumes that the SQUID is initially in the negative state, indicated by the lower curve (−) in FIG. 2. If the SQUID is initialized to the positive state (+), the first line of the table should indicate a preset output of +1 instead of −1.

| Pulses detected | Action Taken |
|---|---|
| $\overline{A}$ and $\overline{B}$ | Preset output to −1 |
| $A$ and $\overline{B}$ | Preset output to +1 |
| $\overline{A}$ and $B$ | Output preset value |
| $A$ and $B$ | Preset output to −1 |
| A n times | Overflow output = n − 1 and preset output to +1 |
| B n times | Overflow output = −(n − 1) and preset output to −1 |

It will be apparent that the feedback register contains at all times a digital quantity indicative of the amount by which the analog signal differs from a current at the desired operating point. The feedback register has a full-scale value equivalent to the span between adjacent operating points in the characteristic curve of the device, and also carries a sign indication to show whether the current is tending to drive the operating point above or below the desired operating point.

When the feedback register overflows, this indicates that the device is applying a correction equivalent to a full span between adjacent operating points. At this stage, an overflow signal is applied over line 69 to the integer register, to increment it by +1 or −1. The feedback register is simultaneously cleared follows its normal functions, but at a new operating point on the curve.

It will be appreciated that the feedback register and the integer register together define a digital value equivalent to the input analog current. More accurately, they define the value of the input signal relative to a given starting point. For any particular setting of the integer register, the feedback register applies corrections over a range of plus and minus one full span between adjacent operating points on the curve.

The principal advantage of the invention over other SQUID A/D converters is that it provides extremely high sensitivity but a large dynamic range and the ability to handle rapid slew rates. Also, because the device is implemented as a monolithic cryogenic structure it enjoys a practically complete absence of noise problems. It will by now be understood that the sensitivity of the device is obtained by sensing each discrete fluxoid transition in the SQUID, caused by the combined effects of the analog signal current, the correction current, and the high frequency dither signal. The presence or absence of a fluxoid event is interpreted by the control logic, and the feedback register is adjusted accordingly to produce a correction current that maintains the desired operating point for the SQUID.

The normal sensitivity of a SQUID quantizer is largely determined by the magnitude of one magnetic flux quantum, given by:

$$\Phi_0 = h/2e = 2.07 \times 10^{-15} Wb.$$

In the device of the invention, the sensitivity is a fraction of this quantum, given by:

$$\Phi_0 \times 2^{-N},$$

where N is the number of bits of precision in the DAC and in the feedback register.

The absolute sensitivity will also be determined in part by the SQUID input inductance and the efficiency of coupling with the input signal. These considerations are similar to those relating to dc SQUID sensors and amplifiers. The sensitivity will also depend on the precision of the DAC, and the precision of the dither amplitude in relation to the current-flux curve. This amplitude directly affects the precision with which the SQUID can be locked to a desired operating point. If the dither amplitude is too large, there will be a dead zone in which the analog signal can change without detection.

The total dynamic range of the device is, as has been described, not limited by the number of bits N. The dynamic range is given by:

$$\Phi_0 \times 2^M,$$

where M is the number of bits in the integer register.

The sampling rate of the converter is limited by the feedback time constant, which is the total time required for pulse detection, accumulation in the feedback register, DAC operation, and analog settling time. Single flux quantum pulses can be generated in several picoseconds, and a Josephson DAC can cycle in less than half of a nanosecond. Moreover, the control logic is relatively simple. Accordingly, the total loop time constant should be on the order of $10^{-9}$ second, which permits sampling rates approaching 1 GSps (gigasample per second) and bandwidths up to approximately 500 Mhz. The clock frequency should be around 10 GHz or higher.

The digital-to-analog converter (DAC) may be of any conventional type, but for high performance, Josephson junctions should also be employed in the DAC. One possible arrangement for a DAC using Josephson junctions is shown in FIG. 3. Basically, the DAC consists of multiple stages, indicated at 70.1, 70.2, 70.3 and 70.4, from the least significant to the most significant. The least-significant stage includes a single junction 72, the next stage uses two junctions 74 in series, the next four junctions 76 in series and the most-significant stage uses $2^N$ junctions 78 in series. The digital quantity to be converted is applied to the various stages, each of which functions as a voltage generator. The voltages are added together at a single adding junction 80, for output from the converter. Alternative designs are possible, using a single junction at each stage and an appropriate resistive ladder to apply binary weighting to the stages. Both techniques are well known in conventional digital-to-analog converters, and are applied here using Josephson junctions as the voltage sources. This has the advantage of maintaining the whole A/D circuit at low temperatures, and provides for high-speed operation and economies of manufacture.

It will be appreciated from the foregoing that the present invention represents a significant advance in the field of SQUID analog-to-digital converters. In particular, the invention provides a highly sensitive converter without sacrificing dynamic range, and including the ability to handle rapid input slew rates. It will also be appreciated that, although one embodiment of the invention has been described in detail for purposes of illustration, various modifications may be made without departing from the spirit and scope of the invention. Accordingly, the invention is not to be limited except as by the amended claims.

I claim:

1. A superconducting analog-to-digital converter having high sensitivity and high dynamic range, the converter comprising:

a double-junction superconducting quantum interference device (SQUID) having first and second Josephson junctions and a center-tapped load inductance;

means for applying a constant gate current to the center of the load inductance;

means for applying a bidirectionally varying analog signal current to the load inductance, wherein positive incremental changes in the load inductance current result in the generation of output pulses across the first junction, and negative incremental changes in the load inductance current result in output pulses across the second junction;

means for applying a correction current signal to the load inductance to maintain the SQUID at a desired operating point in its flux-current characteristic;

means for applying a high-frequency dither signal current to the load inductance such that, when the correction current is maintaining the SQUID at its desired operating point, each cycle of the dither current signal produces an output pulse from each of the junctions;

means for generating from the output pulses a digital value equivalent to the analog input signal; and means for generating the correction current from the digital value;

whereby the correction current is indicative of the amount by which the analog signal would, in the absence of the correction signal, move the operating point away from its desired location.

2. A superconducting analog-to-digital converter as defined in claim 1, wherein the means for generating a digital equivalent from the voltage pulses includes:

means for detecting the voltage pulses from the SQUID;

control logic means for generating incremental signals of a first type indicative of a move away from the operating point, and incremental signals of a second type indicative of a move equivalent to one or more whole flux quanta, whereby the incremental signals of the first type indicate a fractional signal movement within a span of one flux quantum and the incremental signals of the second type indicate signal movement in integral multiples of a flux quantum.

3. A superconducting analog-to-digital converter as defined in claim 2, wherein the means for generating a digital equivalent from the output pulses further includes:

a feedback register for receiving the incremental signals of the first type;

an integer register for receiving the incremental signals of the second type; and digital-to-analog converter coupled to the feedback register, for converting the accumulated signals of the first type into a corresponding analog signal for connection to the means for applying a correction signal;

whereby the correction signal is effective to maintain the desired operating point of the SQUID.

4. A superconducting analog-to-digital converter as defined in claim 3, wherein the means for generating a digital equivalent from the output pulses further includes:

overflow means connecting the feedback register and the integer register, responsive to an overflow condition of the feedback register and effective to zero the feedback register and increment the integer register.

5. A superconducting analog-to-digital converter as defined in claim 4, wherein:

the digital-to-analog converter, the control logic means and the means for detecting the output pulses are all Josephson junction devices and are formed monolithically with the other components of the analog-to-digital converter.

6. A superconducting analog-to-digital converter having high sensitivity and high dynamic range, the converter comprising:

a double-junction superconducting quantum interference device (SQUID) having first and second Josephson junctions and a center-tapped load inductance;

means for applying a constant gate current to the center of the load inductance;

means for applying a bidirectionally varying analog signal current to the load inductance, wherein positive incremental changes in the load inductance current result in the genera of output pulses across the first junction, and negative incremental changes in the load inductance current result in output pulses across the second junction;

means for applying a correction current signal to the load inductance, to maintain the SQUID at a desired operating point in its flux-current characteristic;

means for applying a high-frequency dither signal current to the load inductance, the amplitude of the dither current being selected as just sufficient to produce an output pulse from each of the junctions of the SQUID during each cycle of the dither signal current, when the correction current is maintaining the SQUID at its desired operating point;

means for detecting the output pulses from the junctions of the SQUID;

control logic means for generating incremental signals of a first type indicative of a move away from the operating point, and incremental signals of a second type indicative of a move equivalent to one or more whole flux quanta, whereby the incremental signals of the first type indicate a fractional signal movement within a span of one flux quantum and the incremental signals of the second type indicate signal movement in integral multiples of a flux quantum;

a feedback register for receiving the incremental signals of the first type;

an integer register for receiving the incremental signals of the second type; and a digital-to-analog converter coupled to feedback register, for converting the accumulated signals of the first type into a corresponding analog signal for connection to the means for applying a correction signal;

whereby the correction signal is effective to maintain the desired operating point of the SQUID.

7. A superconducting analog-to-digital converter as defined in claim 6, wherein:

the digital-to-analog converter, the control logic means and the means for detecting the output pulses are all Josephson junction devices and are formed monolithically with the other components of the analog-to-digital converter.

8. A method of converting an analog signal to a digital signal using a double-junction superconducting quantum interference device (SQUID), comprising the steps of:

applying the analog signal to the SQUID;

applying a gate current to the SQUID to pro a characteristic flux-current curve with periodic hysteresis loops;

applying a high-frequency dither signal to the SQUID to produce two output pulses per cycle of the dither signal, so long as the operating point is maintained at a quiescent point at the center of one of the hysteresis loops;

detecting the presence or absence of output pulses from the SQUID junctions;

determining from the detected pulses whether the analog signal applied to the SQUID is tending to move the operating point on the SQUID characteristic curve;

incrementing a feedback register if movement is sufficient to result in non-detection of one of the pulses normally expected in a cycle;

converting the value stored in the feedback register into an analog correction signal; and applying the correction signal to the SQUID to compensate for the detected movement in the operating point, to lock the operating point at a desired position;

whereby the feedback register is continuously indicative of the degree by which the analog signal differs from the analog signal corresponding to the operating point.

9. A method as defined in claim 8, and further including the steps of:

determining from the detected pulses whether the analog signal has slewed from its previously detected value by least one full quantum; and incrementing an integer register to record the number of full quanta by which the analog signal has varied, whereby the integer register and the feedback register together indicate the digital equivalent of the analog signal.

10. A method as defined in claim 9, and further including the steps of:

detecting when the feedback register overflows, which condition is indicative of a full quantum of movement of the analog signal; and incrementing the integer register and simultaneously clearing the feedback register when overflow is detected in the feedback register.

11. A superconducting magnetometer having high sensitivity and high dynamic range, comprising:

a double-junction superconducting quantum interference device (SQUID) having first and second Josephson junctions and a center-tapped load inductance;

means for applying a constant gate current to the center of the load inductance;

means for applying a bidirectionally varying analog signal current, corresponding to a varying magnetic field to be measured, to the load inductance, wherein positive incremental changes in the load inductance current result in the generation of output pulses across the first junction, and negative incremental changes in the load inductance current result in output pulses across the second junction;

means for applying a correction current signal to the load inductance to maintain the SQUID at a desired operating point in its flux-current characteristic;

means for applying a high-frequency dither signal current to the load inductance such that, when the correction current is maintaining the SQUID at its desired operating point, each cycle of the dither current signal produces an output pulse from each of the junctions;

means for generating from the output pulses a digital value equivalent to the analog input signal; and means for generating the correction current from the digital value;

whereby the correction current is indicative of the amount by which the analog signal would, in the absence of the correction signal, move the operating point away from its desired location.

12. A superconducting magnetometer as defined in claim 11, wherein the means for generating a digital equivalent from the voltage pulses includes:

means for detecting the voltage pulses from the SQUID;

control logic means for generating incremental signals of a first type indicative of a move away from the operating point, and incremental signals of a second type indicative of a move equivalent to one or more whole flux quanta, whereby the incremental signals of the first type indicate a fractional signal movement within a span of one flux quantum and the incremental signals of the second type indicate signal movement in integral multiples of a flux quantum.

13. A superconducting magnetometer as defined in claim 12, wherein the means for generating a digital equivalent from the output pulses further includes:

a feedback register for receiving the incremental signals of the first type;

an integer register for receiving the incremental signals of the second type; and a digital-to-analog converter coupled to the feedback register, for converting the accumulated signals of the first type into a corresponding analog signal for connection to the means for applying a correction signal;

whereby the correction signal is effective to maintain the desired operating point of the SQUID.

14. A superconducting magnetometer as defined in claim 13, wherein the means for generating a digital equivalent from the output pulses further includes:

overflow means connecting the feedback register and the integer register, responsive to an overflow condition of the feedback register and effective to zero the feedback register and increment the integer register.

15. A superconducting magnetometer as defined in claim 14, wherein:

the digital-to-analog converter, the control logic means and the means for detecting the output pulses are all Josephson junction devices and are formed monolithically with the other components of the magnetometer.

16. A method for measurement of magnetic fields using a double-junction superconducting quantum interference device (SQUID), comprising the steps of:

detecting a magnetic field as an analog signal;

applying the analog signal to the SQUID;

applying a gate current to the SQUID to produce a characteristic flux-current curve with periodic hysteresis loops;

applying a high-frequency dither signal to the SQUID to produce two output pulses per cycle of the dither signal, so long as the operating point is maintained at a quiescent point at the center of one of the hysteresis loops;

detecting the presence or absence of output pulses from the SQUID junctions;

determining from the detected pulses whether the analog signal applied to the SQUID is tending to move the operating point on the SQUID characteristic curve;

incrementing a feedback register if movement is sufficient to result in non-detection of one of the pulses normally expected in a cycle;

converting the value stored in the feedback register into an analog correction signal; and applying the correction signal to the SQUID to compensate for the detected movement in the operating point, to lock the operating point at a desired position;

whereby the feedback register is continuously indicative of the degree by which the analog signal differs from the analog signal corresponding to the operating point.

17. A method as defined in claim 16, and further including the steps of:

determining from the detected pulses whether the analog signal has slewed from its previously detected value by at least one full quantum; and incrementing an integer register to record the number of full quanta by which the analog signal has varied, whereby the integer register and the feedback register together indicate the digital equivalent of the analog signal and the measured magnetic field.

18. A method as defined in claim 17, and further including the steps of:

detecting when the feedback register overflows, which condition is indicative of a full quantum of movement of the analog signal; and incrementing the integer register and simultaneously clearing the feedback register when overflow is detected in the feedback register.

* * * * *